(12) United States Patent
Kosugi

(10) Patent No.: US 9,588,167 B2
(45) Date of Patent: Mar. 7, 2017

(54) RECEIVER

(71) Applicant: KABUSHIKI KAISHA TOKAI RIKA DENKI SEISAKUSHO, Aichi (JP)

(72) Inventor: Masanori Kosugi, Aichi (JP)

(73) Assignee: KABUSHIKI KAISHA TOKAI RIKA DENKI SEISAKUSHO, Aichi (JP)

( * ) Notice: Subject to any disclaimer, the term of this patent is extended or adjusted under 35 U.S.C. 154(b) by 207 days.

(21) Appl. No.: 14/570,279

(22) Filed: Dec. 15, 2014

(65) Prior Publication Data

US 2015/0177307 A1 Jun. 25, 2015

(30) Foreign Application Priority Data

Dec. 19, 2013 (JP) .................. 2013-262794

(51) Int. Cl.
  *G01R 31/04* (2006.01)
  *H04B 1/18* (2006.01)
(52) U.S. Cl.
  CPC ............... *G01R 31/04* (2013.01); *H04B 1/18* (2013.01)
(58) Field of Classification Search
  None
  See application file for complete search history.

(56) References Cited

U.S. PATENT DOCUMENTS

| 2006/0026650 A1 | 2/2006 | Kim et al. |
| 2006/0208855 A1 | 9/2006 | Okada |
| 2013/0187807 A1 | 7/2013 | Peng et al. |

FOREIGN PATENT DOCUMENTS

| JP | 2000-49718 | 2/2000 |
| JP | 2006-246135 | 9/2006 |
| JP | 2006-319731 | 11/2006 |
| JP | 2009-290773 | 12/2009 |
| JP | 2013-214865 | 10/2013 |
| WO | 2013/131230 | 9/2013 |

OTHER PUBLICATIONS

English Translation of JP 2013-214864 A.*
English Translation of JP 2006-319731 A.*
Search report from E.P.O., mail date is May 6, 2015.

* cited by examiner

*Primary Examiner* — Paresh Patel
(74) *Attorney, Agent, or Firm* — Greenblum & Bernstein, P.L.C.

(57) ABSTRACT

A receiver includes an internal antenna installed on a substrate and capable of receiving a wireless signal, and an external antenna connected to a connector, which is arranged on the substrate, and capable of receiving the wireless signal. A demodulator is arranged on the substrate and demodulates the wireless signals received through the internal antenna and the external antenna. An applying circuit is arranged on the substrate and applies a voltage to the external antenna via the connector. A disconnection detector is arranged on the substrate and detects whether the external antenna is disconnected based on a voltage or current applied by the applying circuit. The internal antenna forms a part of the applying circuit.

7 Claims, 3 Drawing Sheets

RECEIVER

CROSS-REFERENCE TO RELATED APPLICATIONS

This application is based upon and claims the benefit of priority from prior Japanese Patent Application No. 2013-262794, filed on Dec. 19, 2013, the entire contents of which are incorporated herein by reference.

FIELD

The present invention relates to a receiver that includes an internal antenna and an external antenna, and that receives a wireless signal.

BACKGROUND

Conventionally, a receiver includes an antenna, which receives a wireless signal, and a processing unit. The processing unit is connected to the antenna by a signal line and obtains information from the wireless signal received by the antenna. In the receiver, when breaking has occurred in the signal line that connects the antenna and the processing unit, the wireless signal received by the antenna is not supplied to the processing unit. In such a case, the receiver does not work. Accordingly, the receiver includes a breaking detecting device that detects the occurrence of breaking in the signal line between the antenna and the processor.

Japanese Laid-Open Patent Publication No. 2000-49718 describes a conventional example of a breaking detecting device. The breaking detecting device includes a supply circuit for supplying a direct current to an antenna via a resistor, and a breaking detector for detecting a current that flows to the resistor from the supply circuit and determining whether breaking has occurred in the signal line connected with the antenna. When breaking has not occurred, the supply circuit forms a closed circuit. Thus, the breaking detector detects a current corresponding to the voltage applied to the resistor. When breaking has occurred, the supply circuit does not form a closed circuit and thus current does not flow to the resistor. Thus, the breaking detector does not detect a current. In this manner, the breaking detector detects whether breaking has occurred based on the current supplied from the supply circuit.

SUMMARY

As the transmission distance of the wireless signal via the signal line becomes longer, it becomes more difficult to obtain information from the wireless signal. In order to suppress such a signal transmission loss, it is preferable to shorten as far as possible the length of the signal line that connects the antenna and the processor.

There are receivers that are capable of receiving a wireless signal by using a plurality of antennas, for example, an internal antenna installed on a substrate and an external antenna externally connected to a connector arranged in the substrate. Such a receiver may also include the breaking detecting device to detect removal of the connector, that is, the external antenna, and breaking of the signal line between the external antenna and the processing unit due to other factors. In such a structure, it is also preferable to shorten the length of the signal line between the connector (i.e., external antenna) and the processing unit so as to reduce the signal transmission loss. However, when the processing unit is laid out near the connector to shorten the length of the signal line, the processing unit is positioned between the connector and the breaking detector. Therefore, it is necessary to arrange the connection line that connects the connector and the breaking detector so as to bypass the processing unit that processes the wireless signal. This complicates the arrangement of the connection line.

The present invention provides a receiver that detects disconnection of an external antenna by a simple wiring layout while using both of an internal antenna and the external antenna.

A first aspect of the present invention is a receiver. The receiver includes an internal antenna installed on a substrate and configured to receive a wireless signal, and an external antenna connected to a connector, which is arranged on the substrate, and configured to receive the wireless signal. A demodulator is arranged on the substrate and configured to demodulate the wireless signals received through the internal antenna and the external antenna. An applying circuit is arranged on the substrate and configured to apply a voltage to the external antenna via the connector. A disconnection detector is arranged on the substrate and configured to detect whether the external antenna is disconnected based on a voltage or current applied by the applying circuit. The internal antenna forms a part of the applying circuit.

According to the present invention, it becomes possible to detect disconnection of the external antenna by a simple wiring layout while using the internal antenna and the external antenna.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DESCRIPTION OF THE EMBODIMENTS

First Embodiment

A receiver 1 according to a first embodiment will now be described with reference to the drawings.

<Structure of Receiver>

Figure 1:
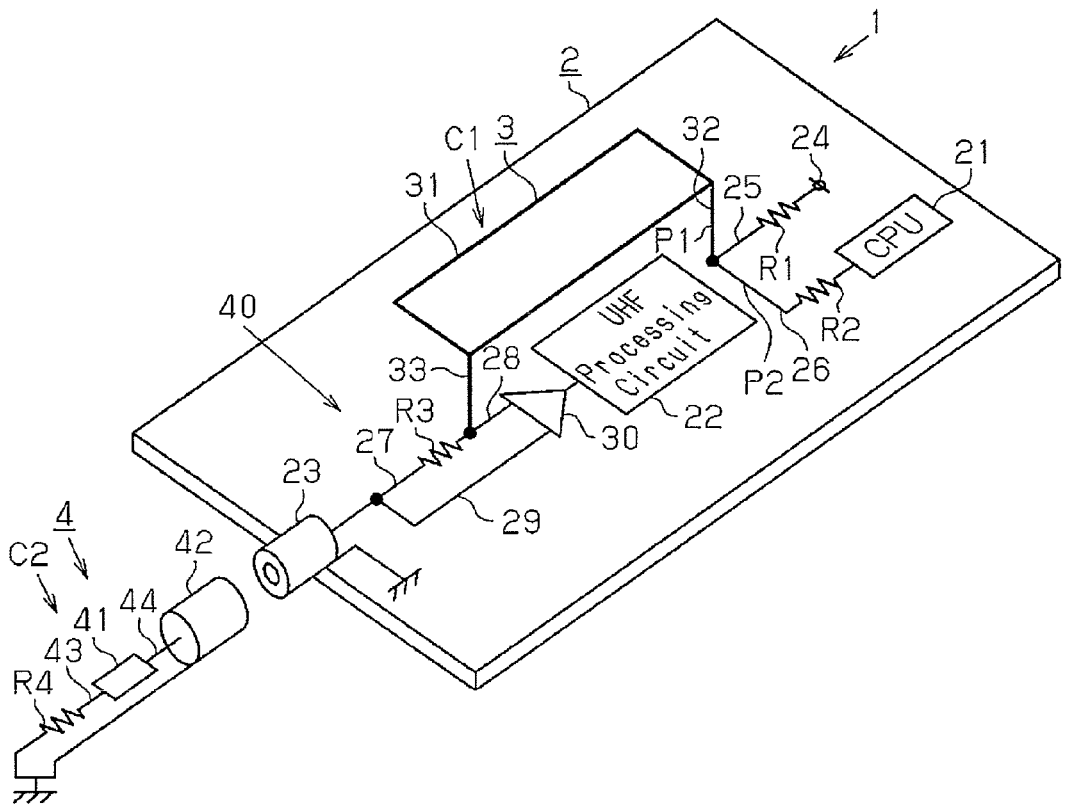
FIG. 1 is a schematic perspective view of a receiver according to a first embodiment.

As illustrated in FIG. 1, the receiver 1 includes a substrate 2, an internal antenna 3, and an external antenna 4.

The internal antenna 3 includes an antenna body 31 that receives a wireless signal of an Ultra High Frequency (UHF) band, and two supporting lines 32 and 33 extending from the antenna body 31 toward the substrate 2. Each of the supporting lines 32 and 33 is connected to the substrate 2 by solder. Further, the supporting line 32 is connected to each of connection lines 25 and 26 by solder. The supporting line 33 is connected to each of connection lines 27 and 28 by solder.

The external antenna 4 includes an antenna body 41 that receives the wireless signal of the UHF band, and a male connector 42 that is connected to one end of the antenna body 41 by a connection line 44. The male connector 42 can be connected to a female connector 23 that is arranged on the substrate 2. The other end of the antenna body 41 is connected to a connection line 43, which is connected to the ground via a resistor R4. Thus, the antenna body 41 is grounded via the connection line 43 and the resistor R4. The connection line 43 is also connected to the shield of the male connector 42.

The substrate 2 includes a CPU 21, a UHF processing circuit 22, the female connector 23, a power supply 24, connection lines 25, 26, 27, 28, and 29, and a combiner 30. The connection line 25 includes a resistor R1 and connects the power supply 24 and the supporting line 32. The connection line 26 includes a resistor R2 and connects the CPU 21 and the supporting line 32. The connection line 27 includes a resistor R3 and connects the female connector 23 and the supporting line 33. The connection line 28 connects the combiner 30 and the supporting line 33. The connection line 29 connects the combiner 30 to a node between the resistor R3 on the connection line 27 and the female connector 23. The combiner 30 is connected to the UHF processing circuit 22. The combiner 30 combines a wireless signal received by the internal antenna 3 and a wireless signal received by the external antenna 4, and transmits the combined signal to the UHF processing circuit 22. The shield of the female connector 23 is grounded by a connection line. The resistor R1 is an example of a first resistor. The resistor R4 is an example of a second resistor. The resistor R3 is an example of a third resistor.

The CPU 21 functions as a disconnection detector that detects whether the external antenna 4 is disconnected. The UHF processing circuit 22 functions as a demodulator that obtains information from the combined signal of the wireless signal received by the internal antenna 3 and the wireless signal received by the external antenna 4. The female connector 23 is an example of a connector arranged on the substrate 2. The power supply 24 is formed to generate a voltage $V_d$.

In the receiver 1, a first path P1 that includes the internal antenna 3 and the external antenna 4 is formed between the power supply $V_d$ and the ground. Further, a second path P2 connected in parallel to the first path P1 is formed. The CPU 21 is arranged in the second path P2. The first path P1 includes a first circuit C1 and a second circuit C2 that are connected in series via the connector 23. The first circuit C1 includes the connection line 25 (resistor R1), the internal antenna 3, and the connection line 27 (resistor R3) that are connected in series. The second circuit C2 includes the external antenna 4 and the connection line 43 (resistor R4) that are connected in series. The connection line 26 is connected to a node between the connection line 25 and the supporting line 32. Therefore, the second path P2 is connected in parallel to the first path P1. In the present embodiment, the first path P1 and the second path P2 form an applying circuit 40.

The substrate 2 and the internal antenna 3 are housed in a case (not illustrated) in the state that the female connector 23 is exposed.

<Operation of Receiver>

Next, the operation of the receiver 1 will now be described. The external antenna 4 is connected to the substrate 2 through the connection between the male connector 42 and the female connector 23. Therefore, the ground potential of the male connector 42 and the ground potential of the female connector 23 are the same potentials.

Figure 2:
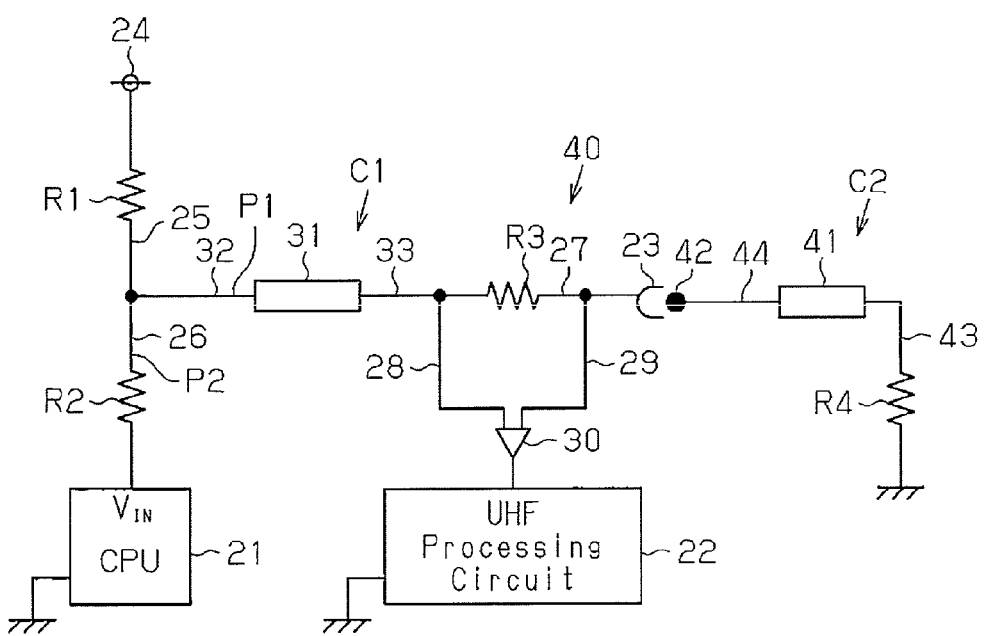
FIG. 2 is an equivalent circuit diagram of the receiver illustrated in FIG. 1.

As illustrated in FIG. 2, the power supply 24 is grounded via the connection line 25 (resistor R1), the supporting line 32, the antenna body 31, the supporting line 33, the connection line 27 (resistor R3), the female connector 23, the male connector 42, the connection line 44, the antenna body 41, and the connection line 43 (resistor R4). The power supply 24 is also connected to the CPU 21 via the connection line 25 (resistor R1) and the connection line 26 (resistor R2). Thus, the direct current supplied from the power supply 24 flows to the first path P1, which includes the internal antenna 3 and the external antenna 4, and the second path P2 connected to the CPU 21. Accordingly, a voltage is applied to each of the first and second paths P1 and P2 in accordance with a ratio of a resistance value of the first path P1 to a resistance value of the second path P2.

In this case, a voltage $V_{IN}$ applied to the CPU 21 via the second path P2 is expressed by the following Equation 1.

$$V_{IN}=(R3+R4)\times V_d/(R1+R3+R4) \qquad \text{(Equation 1)}$$

When the external antenna 4 has been removed from the substrate 2, or when breaking has occurred in the path through which current flows to the external antenna 4, the first path P1 is not closed. Thus, the current supplied from the power supply 24 is supplied to the CPU 21 via the resistors R1 and R2. In this case, the voltage $V_{IN}$ applied to the CPU 21 is expressed by the following Equation 2.

$$V_{IN}=V_d \qquad \text{(Equation 2)}$$

The CPU 21 monitors the voltage $V_{IN}$ applied to the CPU 21 to detect whether the external antenna 4 is disconnected. The disconnection of the external antenna 4 includes the case where the external antenna 4 has been removed from the substrate 2 (that is, the male connector 42 has been removed from the female connector 23) and the case where breaking has occurred in the path through which current flows to the external antenna 4.

In the present embodiment, as illustrated in FIG. 1, the current is supplied from the power supply 24 to the external antenna 4 via the internal antenna 3. This eliminates the need to arrange an additional wiring (connection line) that connects the female connector 23 and the CPU 21 while bypassing the UHF processing circuit 22, would otherwise be required in the prior art when the UHF processing circuit 22 is positioned between the female connector 23 and the CPU 21 on the substrate 2. This increases the degree of freedom of the position at which the female connector 23 is arranged on the substrate 2. Consequently, the female connector 23 may be arranged at a position adjacent to the UHF processing circuit 22 by a simple wiring layout. Further, the length of the connection line 29 that connects the female connector 23 and the UHF processing circuit 22 becomes short. This suppresses the signal transmission loss. Accordingly, the UHF processing circuit 22 may precisely obtain information from the wireless signal received by the external antenna 4.

The resistor R3 exists in the connection line 27 connecting the internal antenna 3 and the female connector 23. The resistor R3 sets the connection line 27 between the internal antenna 3 and the female connector 23 to a high impedance state. Thus, the wireless signal received by the external antenna 4 is not transmitted to the internal antenna 3 via the connection line 27. In this manner, the resistor R3 functions as a high-impedance setting element. In place of the resistor R3, an inductance coil or a toroidal core (ferrite beads) may be also employed as a high-impedance setting element.

Due to the resistor R3, the wireless signal received by the internal antenna 3 is not transmitted to the external antenna 4 either. Therefore, the wireless signal received by the internal antenna 3 and the wireless signal received by the external antenna 4 are transmitted to the UHF processing circuit 22 via the combiner 30. On the other hand, the direct current flows from the power supply 24 to the external antenna 4 via the internal antenna 3, the female connector 23, and the male connector 42.

The present embodiment has the following advantages.

(1) In the receiver 1 that includes the CPU 21 serving as a disconnection detector for detecting disconnection of the external antenna 4, the internal antenna 3 forms a part of the applying circuit 40. In this structure, even when the UHF processing circuit 22 is positioned between the female connector 23 and the CPU 21 on the substrate 2, the internal antenna 3 connects the female connector 23 and the CPU 21. This eliminates the need to arrange an additional wiring that connects the female connector 23 and the CPU 21 while bypassing the UHF processing circuit 22. This simplifies the wiring layout in the substrate 2 and increases the degree of freedom of arrangement and position of the female connector 23, the UHF processing circuit 22, and the CPU 21 on the substrate 2. Accordingly, the connection lines 28 and 29 that connect the female connector 23 and the UHF processing circuit 22 may be shortened. Further, transmission loss of the signal via the connection lines 28 and 29 may be also suppressed. The receiver 1 receives the wireless signal of the UHF band by the two antennas, that is, the internal antenna 3 and the external antenna 4. Therefore, the receiver 1 may receive the wireless signal more easily than a receiver that includes only one of the internal antenna 3 and the external antenna 4.

(2) The applying circuit 40 that applies a voltage to the external antenna 4 includes the first and second paths P1 and P2 that are connected in parallel. The first path P1 includes the first circuit C1 and the second circuit C2 that are connected in series via the connector 23. The first circuit C1 includes the connection line 25, the internal antenna 3, and the connection line 27 that are connected in series, and the second circuit C2 includes the external antenna 4 and the connection line 43 that are connected in series. The second path P2 includes the connection line 26 connected to the CPU 21. The connection lines 25 to 27 respectively include the resistors R1 to R3, and the connection line 43 includes the resistor R4. According to this structure, when the external antenna 4 is being disconnected, a voltage different from that when the external antenna 4 is not being disconnected is applied to the CPU 21. Therefore, the CPU 21 detects whether the external antenna 4 is being disconnected based on the voltage $V_{IN}$ applied to the CPU 21.

(3) The resistor R3 is connected between the internal antenna 3 and the female connector 23. The resistor R3 sets the connection line 27 between the internal antenna 3 and the female connector 23 to a high impedance state. Accordingly to this structure, transmission of a wireless signal from the external antenna 4 to the internal antenna 3 is suppressed by a simple structure using the resistor R3.

(4) The combiner 30 that includes a first input end connected to the internal antenna 3, a second input end connected to the external antenna 4, and an output end connected to the UHF processing circuit 22 is arranged. The combiner 30 combines the wireless signal received by the internal antenna 3 and the wireless signal received by the external antenna 4. According to this structure, the combined signal generated by the combiner 30 is supplied to the UHF processing circuit 22. Therefore, even when strengths of the wireless signals received by the internal antenna 3 and the external antenna 4 are weak, the UHF processing circuit 22 may easily demodulate the information.

Second Embodiment

Next, a receiver 50 according to a second embodiment will now be described with reference to the drawings. In the second embodiment, the structure of the connection line that connects between the power supply 24, the internal antenna 3, and the external antenna 4 is changed. Elements similar to those in the first embodiment are illustrated by the same reference signs and their description will now be omitted.

<Structure of Receiver>

Figure 3:
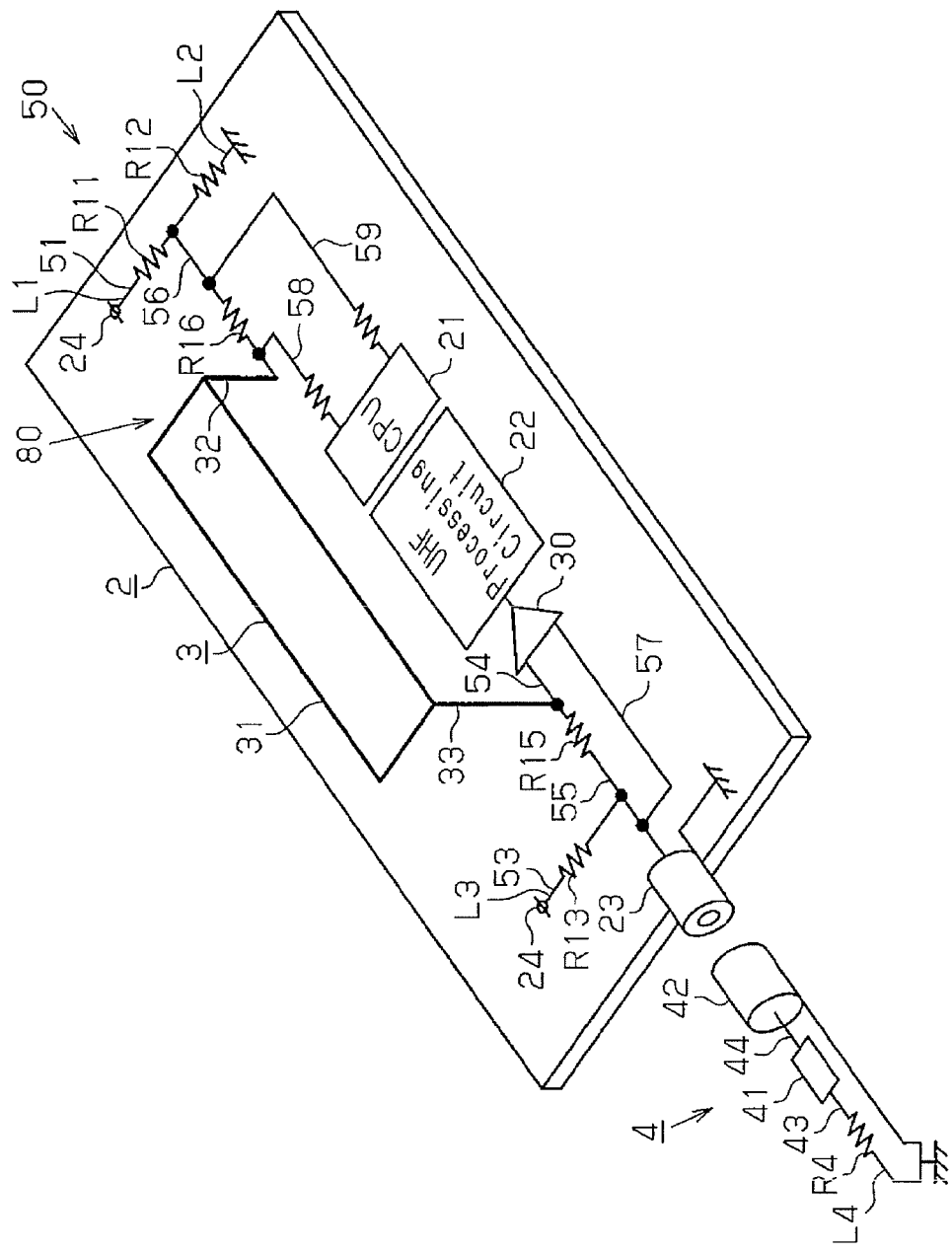
FIG. 3 is a schematic perspective view of a receiver according to a second embodiment.

As illustrated in FIG. 3, the receiver 50 includes the substrate 2, the internal antenna 3, and the external antenna 4.

The substrate 2 includes the CPU 21, the UHF processing circuit 22, the female connector 23, the power supply 24, connection lines 51, 53, 54, 55, 56, 57, 58, and 59, and the combiner 30.

The connection line 51 includes resistors R11 and R12. The connection line 51 is formed by a first connection line L1, which includes a resistor R11 and is connected to the power supply 24, and a second connection line L2, which includes a resistor R12 and is grounded. The connection line 51 (that is, the first and second connection lines L1 and L2) forms a first connection path.

The connection line 53 is arranged as a third connection line L3 including a resistor R13, and the connection line 53 connects the power supply 24 and the female connector 23. The external antenna 4 and the connection lines 43 and 44 form a fourth connection line L4. The connection lines 43, 44, and 53 (that is, the third and fourth connection lines L3 and L4) form a second connection path.

The connection line 54 connects between the supporting line 33 and a first input end of the combiner 30. The connection line 55 includes the resistor R15. The supporting line 33 is connected to one end of the connection line 55. The other end of the connection line 55 is connected to the connection line 53 at a downstream side of the resistor R13 relative to the power supply 24.

The connection line 56 includes a resistor R16. The supporting line 32 is connected to one end of the connection line 56. The other end of the connection line 56 is connected to a node between the resistors R11 and R12 on the connection line 51. The connection lines 55 and 56 and the internal antenna 3 form an intermediate path.

A second input end of the combiner 30 is connected to one end of the connection line 57. The other end of the connection line 57 is connected to the connection line 53 at a downstream side of the resistor R13 relative to the power supply 24.

The CPU 21 is connected to one end of the connection line 58. The other end of the connection line 58 is connected to the connection line 56 at a downstream side of the resistor R16 relative to the power supply 24.

The CPU 21 is connected to one end of the connection line 59. The other end of the connection line 59 is connected to the connection line 56 at an upstream side of the resistor R16 relative to the power supply 24.

Figure 4:
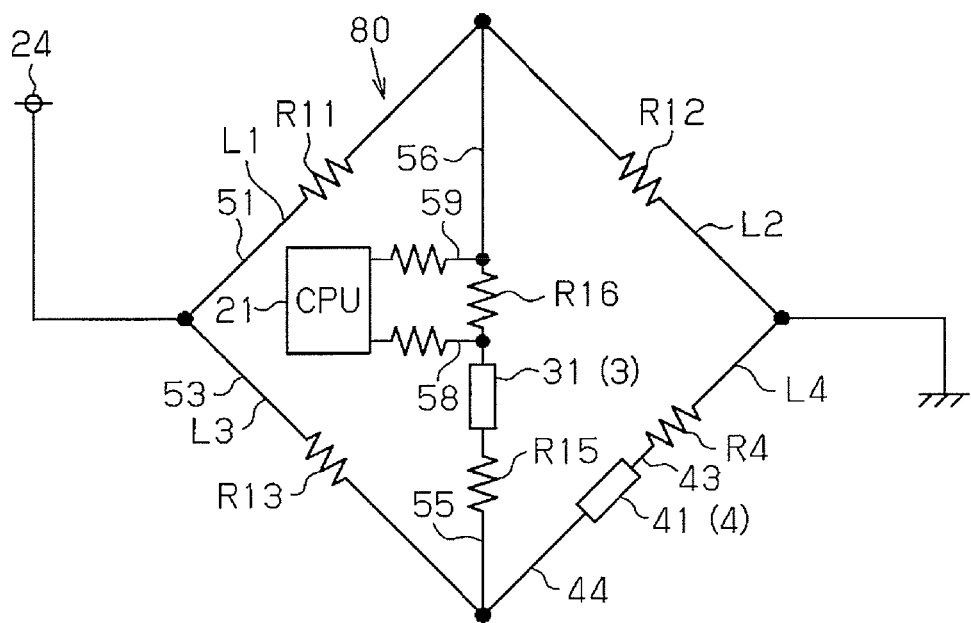
FIG. 4 is an equivalent circuit diagram of the receiver illustrated in FIG. 3.

As illustrated in FIG. 4, an applying circuit 80 according to the second embodiment is formed by a Wheatstone bridge circuit that includes a first connection path (first and second connection lines L1 and L2) and a second connection path (third and fourth connection lines L3 and L4) that are arranged in parallel between the power supply 24 and the ground, and an intermediate path (connection lines 55 and 56 and internal antenna 3) that connects the first connection path and the second connection path. The internal antenna 3 is arranged in the intermediate path. Therefore, the Wheatstone bridge circuit includes the resistors R11, R12, R13, and R4, and the internal antenna 3 is positioned at an intermediate point of the resistors R11, R12, R13, and R4. Resistance values of the resistors R11, R12, R13, and R4 are set to satisfy the relationship expressed by the following Equation 3.

$$R11 \times R4 = R12 \times R13 \qquad \text{(Equation 3)}$$

<Operation of Receiver>

Next, the operation of the receiver 50 will now be described. The external antenna 4 is connected to the substrate 2 through the connection between the male connector 42 and the female connector 23.

As illustrated in FIG. 4, the internal antenna 3 is positioned at the intermediate point of the resistors R11, R12, R13, and R4 of the Wheatstone bridge circuit. Resistance values of the resistors R11, R12, R13, and R4 are set to satisfy the above Equation 3. Thus, the potential difference between the supporting lines 32 and 33 is 0 (zero). Therefore, no current is supplied to the internal antenna 3. That is, when the external antenna 4 is not being disconnected, no current is supplied to the internal antenna 3. Accordingly, the occurrence of migration in the internal antenna 3 may be suppressed.

When the external antenna 4 has been removed from the substrate 2 or when breaking has occurred in the path through which current flows to the external antenna 4, no current is supplied to the resistor R4. Thus, the resistance value of the resistor R4 changes and becomes infinite. Therefore, a potential difference occurs between the supporting line 32 and the supporting line 33, and the current flows to the internal antenna 3.

The second embodiment has the following advantages in addition to the advantages (1) and (4) of the first embodiment.

(5) The applying circuit 80 is formed by the Wheatstone bridge circuit that includes the first connection path (first and second connection lines L1 and L2) and the second connection path (third and fourth connection lines L3 and L4) that are arranged in parallel between the power supply 24 and the ground, and the intermediate path (connection lines 55 and 56 and internal antenna 3) that connects the first connection path and the second connection path. The internal antenna 3 is arranged in the intermediate path. The first connection path includes the resistors R11 and R12, and the second connection path includes the resistors R13 and R4. The resistance values of the resistors R11, R12, R13, and R4 are set at values at which no voltage is applied to the intermediate path. The CPU 21 detects the voltage of the resistor R16 that is arranged in the intermediate path.

According to this structure, when the external antenna 4 has not been disconnected, no current flows to the intermediate path that includes the internal antenna 3. On the other hand, when the external antenna 4 has been disconnected, the potential difference occurs in the intermediate path and current flows to the internal antenna 3. Therefore, the CPU 21 detects whether the external antenna 4 has been disconnected based on the voltage generated in the intermediate path.

(6) When the external antenna 4 has not been disconnected, no voltage is applied to the internal antenna 3. Therefore, no current flows to the internal antenna 3. This suppresses the occurrence of migration in the internal antenna 3. Consequently, the internal antenna 3 properly receives the wireless signal of the UHF band.

It should be apparent to those skilled in the art that the present invention may be embodied in many other specific forms without departing from the spirit or scope of the invention. Particularly, it should be understood that the present invention may be embodied in the following forms.

In each of the above embodiments, a selection switch may be employed in place of the combiner 30. A case where the combiner 30 in the first embodiment is changed to the selection switch will now be described.

Figure 5:
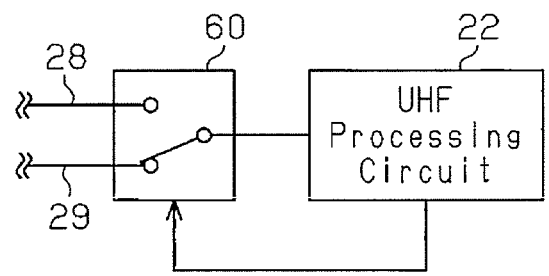
FIG. 5 is a block diagram illustrating another structure.

As illustrated in FIG. 5, a selection switch 60 includes a first input end connected to the connection line 28, a second input end connected to the connection line 29, and an output end connected to the UHF processing circuit 22. The selection switch 60 selectively connects one of the internal antenna 3 and the external antenna 4 to the UHF processing circuit 22. For example, the selection switch 60 switches between the first input end and the second input end based on a switching signal from the UHF processing circuit 22. This structure also has the advantage (1) of the first embodiment. In addition, according to this structure, the UHF processing circuit 22 may determine whether the wireless signal has been received by the internal antenna 3 or by the external antenna 4. Therefore, the UHF processing circuit 22 may estimate the direction in which the signal is transmitted and the position at which the signal is transmitted. The selection switch 60 is not limited to use the switching signal and may periodically switch between the first and second input ends. Further, the selection switch 60 of FIG. 5 may be also applied to the second embodiment.

In each of the above embodiments, although the CPU 21 detects whether the external antenna 4 is disconnected based on the voltage applied from the power supply 24, the CPU 21 may use the current in place of the voltage.

In each of the above embodiments, the UHF processing circuit 22 is positioned between the female connector 23 and the CPU 21 as illustrated in FIG. 1 and FIG. 3. However, the positional relationship between the UHF processing circuit 22, the female connector 23, and the CPU 21 is not limited. By arranging such that the internal antenna 3 forms a part of the applying circuit 40 or the applying circuit 80, the number of wires and the wiring length on the substrate 2 may be reduced regardless of the position of the UHF processing circuit 22.

In each of the above embodiments, although the male connector 42 is arranged on the external antenna 4 and the female connector 23 is arranged on the substrate 2, the arrangement of the male and female connectors 42 and 23 is not limited. The female connector 23 may be arranged on the external antenna 4 and the male connector 42 may be arranged on the substrate 2. Further, the connection between the external antenna 4 and the substrate 2 is not limited to the arrangement using the connectors.

In each of the above embodiments, although the external antenna 4 is arranged by connecting the antenna body 41 and the male connector 42 by the connection line 44, the antenna body 41 and the male connector 42 may be directly connected to each other.

In each of the above embodiments, the shape of the internal antenna 3 and the shape of the external antenna 4 may be appropriately changed.

In each of the above embodiments, although the internal antenna 3 and the external antenna 4 each receive the wireless signal in the UHF band, the internal antenna 3 and the external antenna 4 may receive the wireless signal in other band. In this case, the structure of the demodulator is changed according to the band of the wireless signal that the internal antenna 3 and the external antenna 4 receive.

The above description is intended to be illustrative, and not restrictive. For example, the above-described examples (or one or more aspects thereof) may be used in combination with each other. Other embodiments can be used, such as by one of ordinary skill in the art upon reviewing the above description. Also, in the above Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Description, with each claim standing on its own as a separate embodiment. The scope of the invention should be determined with reference to the appended claims, along with the full scope of equivalents to which such claims are entitled.

The invention claimed is:

1. A receiver comprising:
an internal antenna installed on a substrate and configured to receive a wireless signal;
an external antenna connected to a connector, which is arranged on the substrate, and configured to receive the wireless signal;
a demodulator arranged on the substrate and configured to demodulate the wireless signals received through the internal antenna and the external antenna;
an applying circuit arranged on the substrate and configured to apply a voltage to the external antenna via the connector; and
a disconnection detector arranged on the substrate and configured to detect whether the external antenna is disconnected based on a voltage or current applied by the applying circuit, wherein
the internal antenna forms a part of the applying circuit,
the applying circuit includes a first path in which a first circuit and a second circuit are connected in series via the connector, and a second path connected in parallel to the first path,
the first circuit includes the internal antenna and a first resistor connected in series to the internal antenna,
the second circuit includes the external antenna and a second resistor connected in series to the external antenna,
the first path includes a connection line which connects the internal antenna and the connector and which is set to a high impedance state, and
the disconnection detector is arranged in the second path.

2. The receiver according to claim 1, wherein the first circuit further includes a third resistor connected in series between the internal antenna and the connector.

3. The receiver according to claim 1, further comprising a combiner that includes a first input end connected to the internal antenna, a second input end connected to the external antenna, and an output end connected to the demodulator, wherein the combiner is configured to combine the wireless signal received by the internal antenna and the wireless signal received by the external antenna.

4. The receiver according to claim 1, further comprising a selection switch that includes a first input end connected to the internal antenna, a second input end connected to the external antenna, and an output end connected to the demodulator, wherein the selection switch is configured to selectively connect one of the internal antenna and the external antenna to the demodulator.

5. A receiver comprising:
an internal antenna installed on a substrate and configured to receive a wireless signal;
an external antenna connected to a connector, which is arranged on the substrate, and configured to receive the wireless signal;
a demodulator arranged on the substrate and configured to demodulate the wireless signals received through the internal antenna and the external antenna;
an applying circuit arranged on the substrate and configured to apply a voltage to the external antenna via the connector; and
a disconnection detector arranged on the substrate and configured to detect whether the external antenna is disconnected based on a voltage or current applied by the applying circuit, wherein
the internal antenna forms a part of the applying circuit,
the applying circuit is a Wheatstone bridge circuit including a first connection path, a second connection path, and an intermediate path that connects the first and second connection paths, wherein the first connection path and the second connection path are connected in parallel between a power supply and a ground,
the first and second connection paths include resistors having resistance values that are set such that no voltage is applied to the intermediate path,
the internal antenna is arranged in the intermediate path,
the external antenna is arranged in the first connection path at a downstream side of a connection node between the first connection path and the intermediate path, or in the second connection path at a downstream side of a connection node between the second connection path and the intermediate path, relative to the power supply, and
the disconnection detector is connected to the intermediate path.

6. The receiver according to claim 5, further comprising a combiner that includes a first input end connected to the internal antenna, a second input end connected to the external antenna, and an output end connected to the demodulator,
wherein the combiner is configured to combine the wireless signal received by the internal antenna and the wireless signal received by the external antenna.

7. The receiver according to claim 5, further comprising a selection switch that includes a first input end connected to the internal antenna, a second input end connected to the external antenna, and an output end connected to the demodulator,
wherein the selection switch is configured to selectively connect one of the internal antenna and the external antenna to the demodulator.

* * * * *